United States Patent [19]

Adams et al.

[11] Patent Number: 5,362,334
[45] Date of Patent: Nov. 8, 1994

[54] COMPOSITION AND PROCESS FOR TREATMENT OF METALLIC SURFACES

[75] Inventors: William Adams, Woodbury; Clyde Newcomer, Torrington; Gary B. Larson, Cheshire, all of Conn.

[73] Assignee: MacDermid, Incorporated, Waterbury, Conn.

[21] Appl. No.: 173,908

[22] Filed: Dec. 23, 1993

[51] Int. Cl.$^5$ ............................................. C23C 22/06
[52] U.S. Cl. .................................... 148/268; 148/269;
    106/14.16; 106/14.41; 106/14.44; 548/343.1;
    548/343.5
[58] Field of Search ............... 106/14.15, 14.16, 14.41,
    106/14.44; 148/268, 269; 548/343.1, 343.5;
    252/394

[56] References Cited

U.S. PATENT DOCUMENTS

| | | | |
|---|---|---|---|
| 3,350,211 | 10/1967 | Greenwald | 106/14.16 |
| 3,933,531 | 1/1976 | Sawa et al. | 106/14.16 |
| 3,970,535 | 7/1976 | McGinniss | 522/51 |
| 4,395,294 | 7/1983 | Hobbins | 106/14.16 |
| 4,622,097 | 11/1986 | Tsukagoshi | 156/644 |
| 5,173,130 | 12/1992 | Kinoshita | 148/268 |
| 5,312,927 | 5/1994 | Takada et al. | 548/343.1 |

FOREIGN PATENT DOCUMENTS

| | | | |
|---|---|---|---|
| 2826042 | 5/1991 | European Pat. Off. | |
| 490161 | 6/1992 | European Pat. Off. | 106/14.16 |

*Primary Examiner*—Anthony Green
*Attorney, Agent, or Firm*—John L. Cordani

[57] ABSTRACT

Disclosed is a composition and process for the surface treatment of metallic surfaces, which comprises treating said surface in an aqueous solution comprising a benzimidazole compound having either a halogenated phenyl group, a halogenated benzyl group or a halogenated ethyl phenyl group in the 2-position.

12 Claims, No Drawings

COMPOSITION AND PROCESS FOR TREATMENT OF METALLIC SURFACES

FIELD OF THE INVENTION

The present invention relates to a process for the treatment of metallic surfaces for the protection of the surface from oxidation and for enhancing its solderability. The treatment proposed chemically forms a protective layer on the metal surfaces which layer is exceptionally resistant to high temperature. This treatment is particularly useful as a preflux for copper circuitry prior to soldering.

BACKGROUND OF THE INVENTION

The chemical protection of metallic surfaces such as copper and its alloys from oxidation is well known in the art. The use of various triazoles and imidazoles as anti-oxidants has been known for some time. In fact Benzotriazole is known and has provided excellent anti-oxidation properties for copper and its alloys. These and other anti-oxidants have proved successful as long as the protected surface is not heated or subjected to prolonged exposure.

With the rise of surface mount technology (SMT) in printed circuits boards, the anti-oxidants of the prior art have proven deficient at the high temperatures involved in the multiple soldering operations frequently necessary to produce printed circuit boards with this technology. Antioxidants (or prefluxes) which also protect solderability at elevated temperatures have therefore been sought to fill this need. Therefore, the need to provide a preflux which is easily applied and stable at high temperatures, and thus protects the solderability of copper circuitry is clear. Several advances have been made in this area utilizing alkyl-benzimidazoles. U.S. Pat. No. 4,395,294 reveals the use of 5-methyl benzimidazole. Although this is an improvement on the use of benzotriazole, 5-methyl benzimidazole forms only a very thin protective layer on the copper surfaces and thus its anti-corrosion and solderability properties at high temperatures are insufficient to meet today's needs.

The leading technology in this area today is taught in recently issued U.S. Pat. No. 5,173,130, the disclosure of which is incorporated herein by reference. This patent teaches the use of a benzimidazole compound having an alkyl group of at least 3 carbon atoms at the 2-position in conjunction with an organic acid. The materials taught in this, the Kinoshita, patent are greatly improved over the prior art. Kinoshita provides for improved thermal resistance through the provision of a benzimidazole with a long alkyl chain in the 2-position. The long alkyl chain which Kinoshita stresses as necessary for good thermal resistance causes other problems, however. The long alkyl chain is also very hydrophobic and therefore causes the compounds taught by Kinoshita to have very limited aqueous solubility. This low solubility then causes precipitation of the Kinoshita compounds in aqueous solution ms the solution is used. This obviously causes problems in production, consistency and life.

Thus the need still exists for a pre-flux, anti-oxidant, which possesses excellent thermal resistance and which has good water solubility.

SUMMARY OF THE INVENTION

This invention has answered the need for a pre-flux which has both excellent thermal resistance and which has good solubility in aqueous solutions. It has been discovered that halogenation of the benzimidazole enhances its thermal stability when it is used to treat metallic surfaces. Thus halogenated benzimidazoles possess superior anti-oxidation properties in treating metallic surfaces and protect the solderability of these surfaces even during prolonged exposures to elevated temperatures. Benzimidazoles which have been halogenated, therefore outperform their non-halogenated counterpart.

Kinoshita teaches the need for long alkyl chains at the 2-position of the benzimidazole to improve the benzimidazole's anti-oxidation and solderability performance. Such long chains, however cause the benzimidazole to become less water soluble. This low solubility increases as the aqueous benzimidazole solution is utilized to treat metallic surfaces, causing precipitation to occur. The precipitation then causes performance and consistency problems. With the use of the halogenated benzimidazoles of this invention these problems can be avoided.

Because of the increase in performance of the halogenated benzimidazole, shorter alkyl chains or compact aryl groups can be used in the 2-position while yielding superior thermal performance to benzimidazoles with long chains in the 2-position. These halogenated benzimidazoles can thus outperform the Kinoshita benzimidazoles because they provide superior thermal stability along with increased aqueous solubility. In fact halogenated aryl benzimidazoles such as 2-(parabromo-benzyl)-benzimidazole have the ability to form relatively thin protective layers which provide the same or improved thermal stability in comparison with the kinoshita benzimidazoles which may form thicker layers. The thin protective layers then give the additional advantage of more easily being cleaned by the subsequent solder flux and thus improved solderability.

DETAILED DESCRIPTION OF THE INVENTION

Typical compounds used in carrying out the process of the present invention are compounds represented by the following general formula:

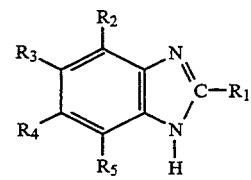

Wherein at least 1 of the constituents, $R_1$, $R_2$, $R_3$, $R_4$ and $R_5$, must be selected from the group consisting of halogens, substituted or unsubstituted halogenated alkyl groups and substituted or unsubstituted halogenated aryl groups; and wherein the remaining constituents, $R_1$, $R_2$, $R_3$, $R_4$ and $R_5$, are selected from the group of consisting of hydrogen, nitro groups, substituted or unsubstituted alkyl groups and substituted or unsubstituted aryl groups.

In the more preferred embodiment of the invention, the compounds used in carrying out the process of this invention are compounds represented by the following general formula:

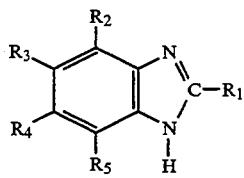

wherein $R_1$ is selected from a group consisting of halogens, substituted or unsubstituted halogenated alkyl groups and substituted or unsubstituted halogenated aryl groups; and wherein $R_2$, $R_3$, $R_4$ and $R_5$ can be selected from a group consisting of hydrogen, halogen, nitro groups or lower alkyl groups.

In the most preferred embodiment of the invention, the compounds used in carrying out the process of the invention are compounds represented by the following general formula:

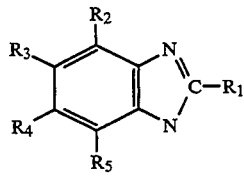

wherein $R_1$ is selected from a group consisting of bromo substituted benzyl, bromo substituted phenyl and bromo substituted ethyl phenyl; and wherein $R_2$, $R_3$, $R_4$ and $R_5$ can be selected from a group consisting of hydrogen, halogen, nitro groups and lower alkyl groups.

It has been found that although long alkyl chains in the 2-position of a benzimidazole create a protective coating on copper or copper alloys which is resistant to elevated temperatures, these same long alkyl chains create solubility problems for these substances in aqueous solution even in the presence of organic acids. It has been found in practice that these benzimidazoles with long alkyl chains in the 2-position have a great tendency to precipitate out of aqueous solutions with organic acids and this precipitate causes problems in the production environment.

It has further been discovered that excellent protective coatings on copper and its alloys can be formed by benzimidazole compounds with halogenated aryl groups in the 2-position. These compounds have proven to chemically form protective layers on copper and its alloys which are very resistant to elevated temperatures and which preserve the solderability of the surfaces. In functionality these 2-halo aryl benzimidazoles perform as well as or better than benzimidazoles with long alkyl chains in the 2-position or 2-aryl benzimidazoles without the halogenation. However, 2-halo aryl benzimidazoles provide the additional advantage of greatly increased solubility in aqueous solutions with organic acids particularly.

In addition, it has been discovered that benzimidazole compounds with halogen substituted aryl groups in the 2-position provide even superior thermal resistance to that taught in the prior art. These 2-halo aryl benzimidazoles also retain increased solubility properties in aqueous acid solution. The most beneficial halogen in this regard is bromine because it provides the greatest thermal resistance. Therefore, the most preferred compounds used in carrying out this process are benzimidazoles with either a bromo substituted phenyl, a bromo substituted benzyl or a bromo substituted ethyl phenyl group in the 2-position.

It is thus important that alkyl chains attached to the benzimidazole be very short in order for the solubility of the resulting compound to be acceptable. Although long alkyl chains, especially in the 2-position, succeed in increasing the thermal resistance of the benzimidazoles in protecting copper and copper alloys, these same long chains decrease solubility. The present invention therefore solves this problem by providing excellent thermal resistance with increased acid solubility.

Acid solutions of the compounds of the invention are preferable since the compounds are most soluble in a moderately acidic environment. The solutions comprise at least 1 compound selected from the group consisting of organic acids, inorganic acids, metallic complexes of organic acids, organo metallic complexes, and metallic salts of inorganic acids. Organic acids are most preferable and can be selected from a wide variety of organic acids such as formic acid, acetic acid, lactic acid, propionic acid, citric acid, glycolic acid, benzoic acid, malic acid and so on. The organic acid is preferably added in an amount of 0.4 to 1.0 % by weight and most preferably from 0.5 to 0.8 % by weight.

The 2-halo aryl benzimidazole is added to the solution in an amount from 0.01 to 0.8 % by weight and most preferably from 0.04 to 0.1% by weight.

In carrying out the present invention, the surface of the copper alloy is first cleaned and possibly etched, then it is subjected to treatment in a solution of the 2-halo-aryl-benzimidazole by immersing the part in such solution or by coating or spraying such solution onto the surface of the part.

At this step of treatment of the surface of the copper or copper alloy with the aqueous acidic solution of the 2-halo aryl benzimidazole, the temperature of said solution is from about 70° to 160° F. and preferably from about 100° to 140° F. The contact time can be from 10 to 300 seconds and is preferably from 20 to 80 seconds.

This invention is further described in the following examples which are given for illustrative purposes only and are in no way limiting. All examples used the same pretreatment cycle:

| | |
|---|---|
| Alkaline or Acid Soak Cleaner | 5 minutes, 165° F. |
| Rinse | 2 minutes, Room Temp. |
| Rinse | 3 minutes, Room Temp. |
| Sodium Persulfate/Sulfuric Acid Microetch | 1 minute, 92° F. |
| Rinse | 2 minutes, Room Temp. |
| Organic Preflux Coating | 40 seconds, 110° F. |
| Rinse | 2 minutes, Room Temp. |

This pretreatment cycle was maintained constant throughout the examples except that the composition of the Organic Preflux Coating was varied in each example.

EXAMPLE I (Control)

Twelve printed circuit boards with copper circuits, pads, and holes were processed through the standard pretreatment cycle. The organic preflux solution had the following composition:

| | % by weight |
|---|---|
| Water | 94.5997 |
| Formic Acid | 5.0 |

| | % by weight |
|---|---|
| 2-nonyl Benzimidazole | 0.4 |
| Copper (II) Chloride | 0.0003 |

Three boards were then processed through 1 thermal excursion. A thermal excursion consists of exposing the board to infrared energy for approximately 2 minutes with the board itself reaching a temperature of 550° F.

The second set of 3 boards were processed through 2 consecutive thermal excursions, the third set of 3 boards through 3 consecutive thermal excursions and the fourth set of 3 boards through 4 consecutive thermal excursions. These thermal excursions simulate the processing a board goes through prior to soldering in conveyorized manufacturing equipment. All twelve boards were then treated with a no clean/no residue solder flux and floated in molten solder at 550° F. for 10 seconds. The boards were cooled and the percentage area of copper that was effectively covered with solder was recorded.

| No. of Thermal Excursions | Average % Area of Copper Soldered |
|---|---|
| 1 | 100 |
| 2 | 100 |
| 3 | 97.5 |
| 4 | 94.1 |

After this test, numerous boards were processed through the standard pretreatment cycle and the organic preflux. It was noticed that after processing a number of boards through this preflux, the preflux began to precipitate causing a non homogeneous solution. This caused significant difficulty in processing and caused the performance of the organic preflux to diminish significantly so that it needed to be pre-maturely replaced.

EXAMPLE II

Twelve printed circuit boards with copper circuits pads and holes were processed exactly as in Example I except that the organic preflux had the following composition:

| | % by weight |
|---|---|
| Water | 95.5970 |
| Formic Acid | 4.0 |
| 2-chlorobenzyl benzimidazole | 0.4 |
| Copper (II) Chloride | 0.0003 |

The following results were achieved:

| No. of Thermal Excursions | Average % Area of Copper Soldered |
|---|---|
| 1 | 100 |
| 2 | 100 |
| 3 | 100 |
| 4 | 98.7 |

Finally numerous boards were processed through the standard pretreatment cycle and the organic preflux. No precipitation of the organic preflux solution occurred. This composition was therefore useful in processing boards for about five times longer than the composition of Example I because of its increased solubility.

EXAMPLE III

Fifteen printed circuit boards with copper circuits, pads and holes were processed exactly as in Example I except that the organic preflux had the following composition:

| | % by weight |
|---|---|
| Water | 92.3997 |
| Formic Acid | 7.0 |
| 2-Bromobenzyl benzimidazole | 0.6 |
| Copper (II) Chloride | 0.0003 |

The following results were achieved:

| No. of Thermal Excursions | Average % Area of Copper Soldered |
|---|---|
| 1 | 100 |
| 2 | 100 |
| 3 | 100 |
| 4 | 100 |
| 5 | 100 |

Finally numerous boards were processed through the standard pretreatment cycle and the organic preflux. No precipitation of the organic preflux solution occurred. This composition was therefore useful in processing boards for about five times longer than the composition of Example I because of its increased solubility.

EXAMPLE IV

Nine printed circuit boards with copper circuits, pads and holes were processed exactly as in Example I except that the organic preflux had the following composition:

| | % by weight |
|---|---|
| Water | 94.5997 |
| Formic Acid | 4.0 |
| Alkyl imidazole mixture | 0.4 |
| Copper (II) Chloride | 0.0003 |

The following results were achieved:

| No. of Thermal Excursions | Average % Area of Copper Soldered |
|---|---|
| 1 | 80.7 |
| 2 | 60.0 |
| 3 | <50 |

Finally numerous boards were processed through the standard pretreatment cycle and the organic preflux. It was noticed that after processing a number of boards through this preflux, that the preflux began to precipitate causing a non-homogeneous solution. This caused significant difficulty in processing and caused the performance of the preflux to diminish significantly so that it needed to be pre-maturely replaced.

EXAMPLE V

Fifteen printed circuit boards with copper circuits, pads and holes were processed exactly as in Example I except that the organic preflux had the following composition:

|  | % by weight |
| --- | --- |
| Water | 94.6997 |
| Formic Acid | 5.0 |
| Benzyl benzimidazole | 0.3 |
| Copper (II) Chloride | 0.0003 |

The following results were achieved:

| No. of Thermal Excursions | Average % Area of Copper Soldered |
| --- | --- |
| 1 | 100 |
| 2 | 100 |
| 3 | 100 |
| 4 | 100 |
| 5 | 98 |

Finally numerous boards were processed through the standard pretreatment cycle and the organic preflux. No precipitation of the organic preflux solution occurred.

In conclusion, then the performance of the process of this invention, utilizing a 2-halo aryl substituted benzimidazole, was in general superior to that of the prior art which taught a long chain alkyl substitution at the 2-position. The solderability of the process of this invention was excellent and solubility of the composition of the preflux was far superior to the prior art in practice. In addition, it has been shown that a bromo substituted aryl group (particularly a para-bromo substituted aryl group) at the 2-position of the benzimidazole provides solderability performance which is far superior to anything of the prior art.

We claim:

1. A process for chemically forming a protective layer on a metallic surface which comprises treating the metallic surface with an aqueous solution comprising a benzimidazole compound which benzimidazole compound has the formula:

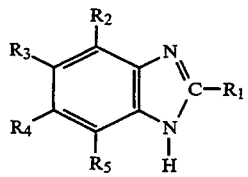

wherein $R_1$ is selected from the group consisting of halogens, substituted or unsubstituted halogenated alkyl groups, and substituted or unsubstituted halogenated aryl groups; and wherein $R_2$, $R_3$, $R_4$, and $R_5$, are independently selected from the group consisting of hydrogen, nitro groups, substituted or unsubstituted alkyl groups, substituted or unsubstituted aryl groups and halogens.

2. A process according to claim 1 wherein $R_1$ is selected from the group consisting of a halogenated benzyl group, a halogenated phenyl group and a halogenated ethyl phenyl group.

3. A process according to claim 1 wherein the aqueous solution also comprises at least 1 compound selected from the group consisting of organic acids, inorganic acids, metallic complexes of organic acids, organo metallic complexes, and metallic salts of inorganic acids.

4. A process according to claim 1 wherein the protective layer is sufficient to protect the solderability of the metallic surface after being heated.

5. A process according to claim 1 wherein the benzimidazole is selected from the group consisting of 2-bromobenzyl benzimidazole, 2-bromophenyl benzimidazole, 2-bromoethylphenyl benzimidazole, 2-chlorobenzyl benzimidazole, 2-chlorophenyl benzimidazole, and 2-chloroethylphenyl benzimidazole.

6. A process according to claim 2 wherein the aqueous solution also comprises at least 1 compound selected from the group consisting of organic acids, inorganic acids, metallic complexes of organic acids, organo metallic complexes, and metallic salts of inorganic acids.

7. A process according to claim 2 wherein the protective layer is sufficient to preserve the solderability of the metallic surface after being heated.

8. A process according to claim 4 wherein the metallic surface comprises copper or a copper alloy.

9. A process according to claim 5 wherein the aqueous solution also comprises at least 1 compound selected from the group consisting of organic acids, inorganic acids, metallic complexes of organic acids, organo metallic complexes, and metallic salts of inorganic acids.

10. A process according to claim 5 wherein the protective layer is sufficient to preserve the solderability of the metallic surface after being heated.

11. A process according to claim 7 wherein the metallic surface comprises copper or a copper alloy.

12. A process according to claim 10 wherein the metallic surface comprises copper or a copper alloy.

* * * * *